United States Patent
Yoon

(10) Patent No.: US 8,406,043 B2
(45) Date of Patent: Mar. 26, 2013

(54) PHASE CHANGE MEMORY APPARATUS HAVING GLOBAL BIT LINE AND METHOD FOR DRIVING THE SAME

(75) Inventor: Hyuck Soo Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 368 days.

(21) Appl. No.: 12/833,082

(22) Filed: Jul. 9, 2010

(65) Prior Publication Data

US 2011/0149643 A1 Jun. 23, 2011

(30) Foreign Application Priority Data

Dec. 23, 2009 (KR) .................. 10-2009-0130176

(51) Int. Cl.
*G11C 11/00* (2006.01)
(52) U.S. Cl. ....................................... 365/163
(58) Field of Classification Search .................... 365/163
See application file for complete search history.

(56) References Cited

U.S. PATENT DOCUMENTS

| 7,227,776 | B2 | 6/2007 | Cho et al. | |
|---|---|---|---|---|
| 7,402,965 | B2 | 7/2008 | Oestreich et al. | |
| 7,453,716 | B2 | 11/2008 | Kim et al. | |
| 2006/0023497 | A1* | 2/2006 | Kawazoe et al. | 365/158 |
| 2009/0141567 | A1 | 6/2009 | Lee et al. | |
| 2009/0141579 | A1* | 6/2009 | Tao et al. | 365/226 |
| 2009/0285009 | A1* | 11/2009 | Kim et al. | 365/148 |
| 2010/0118593 | A1 | 5/2010 | Cho et al. | |
| 2012/0005558 | A1* | 1/2012 | Steiner et al. | 714/773 |

FOREIGN PATENT DOCUMENTS

| JP | 2003-143240 A | 5/2003 |
|---|---|---|
| JP | 2005-056529 A | 3/2005 |
| JP | 2005-092912 A | 4/2005 |
| JP | 2005-317124 A | 11/2005 |
| JP | 2007-004966 A | 1/2007 |
| KR | 1020070019066 A | 2/2007 |
| KR | 1020090052016 A | 5/2009 |
| KR | 1020090120242 A | 11/2009 |

* cited by examiner

*Primary Examiner* — Hoai V Ho
*Assistant Examiner* — Min Huang
(74) *Attorney, Agent, or Firm* — Ladas & Parry LLP

(57) ABSTRACT

A phase change memory apparatus includes a global bit line and an internal power generation circuit. The global bit line is configured to integratedly control a plurality of bit lines. The internal power generation circuit is configured to supply an internal voltage while the global bit line is discharged and configured to control the internal voltage after the global bit line is discharged, when a deep power down mode signal is enabled.

12 Claims, 3 Drawing Sheets

310

350

PHASE CHANGE MEMORY APPARATUS HAVING GLOBAL BIT LINE AND METHOD FOR DRIVING THE SAME

CROSS-REFERENCES TO RELATED APPLICATION

The present application claims priority under 35 U.S.C. §119(a) to Korean application number 10-2009-0130176, filed on Dec. 23, 2009, in the Korean Intellectual Property Office, which is incorporated herein by reference in its entirety as set forth in full.

BACKGROUND

1. Technical Field

The present invention relates to a semiconductor integrated circuit and a method for driving the same, and more particularly, to a phase change memory apparatus having a global bit line and a method for driving the same.

2. Related Art

In general, a semiconductor memory apparatus has a number of different operation modes. These operation modes include a standby mode, an active mode, and a deep power down mode. The standby mode refers to a state in which no chip is selected. The active mode refers to a state in which the read and write operations inherent to the semiconductor memory apparatus can be performed in response to the application of commands. In the standby and active modes, the semiconductor memory apparatus has the same internal voltage levels.

In the deep power down mode, the internal voltages under the standby and active modes are dropped or intercepted, so that circuits operating by the internal voltages are interrupted and the current consumed by an internal voltage generation circuit including a level boosting or level dropping circuit comes down to zero.

A phase change memory apparatus as a next-generation memory apparatus also has a standby mode, an active mode, and a deep power down mode. When entering the deep power down mode, internal power is intercepted so that cell data write current supplied from bit lines is intercepted.

When such a phase change memory apparatus operates in the deep power down mode, since internal voltages are intercepted at the same time with the application of a command for entering the deep power down mode, the discharge of the bit lines cannot be smoothly implemented.

That is to say, when entering the deep power down mode, since the internal voltages are intercepted at the same time with the discharge of global bit lines, a time for discharging the global bit lines is extended, and it is difficult to protect the cell data of the bit lines connected to the global bit lines. Due to this fact, a problem can be caused in terms of latch-up, and a power-up time for returning to a normal operation cannot help but be lengthened.

SUMMARY

In one embodiment of the present invention, a phase change memory apparatus comprises a global bit line configured to integratedly control a plurality of bit lines, and an internal power generation circuit configured to supply an internal voltage while the global bit line is discharged and control the internal voltage after the global bit line is discharged when a deep power down mode signal is enabled.

In another embodiment of the present invention, a phase change memory apparatus comprises a plurality of phase change memory cells disposed between a plurality of word lines and a plurality of bit lines which intersect with each other, a plurality of global bit lines configured to classify the plurality of bit lines into groups each having a predetermined number of bit lines and integratedly control the respective groups of bit lines, an internal voltage generation unit configured to supply power for driving the phase change memory cells, and an internal voltage control unit configured to control driving of the internal voltage generation unit when entering a deep power down mode.

In another embodiment of the present invention, a method for driving a phase change memory apparatus comprises the step of generating an internal voltage until a global bit line connected with a plurality of bit lines of phase change memory cells is completely discharged, and then interrupting supply of the internal voltage, when a deep power down mode is entered.

BRIEF DESCRIPTION OF THE DRAWINGS

Features, aspects, and embodiments are described in conjunction with the attached drawings, in which.

DETAILED DESCRIPTION

Hereinafter, a phase change memory apparatus having a global bit line and a method for driving the same according to the present invention will be described below with reference to the accompanying drawings through embodiments.

Figure 1:
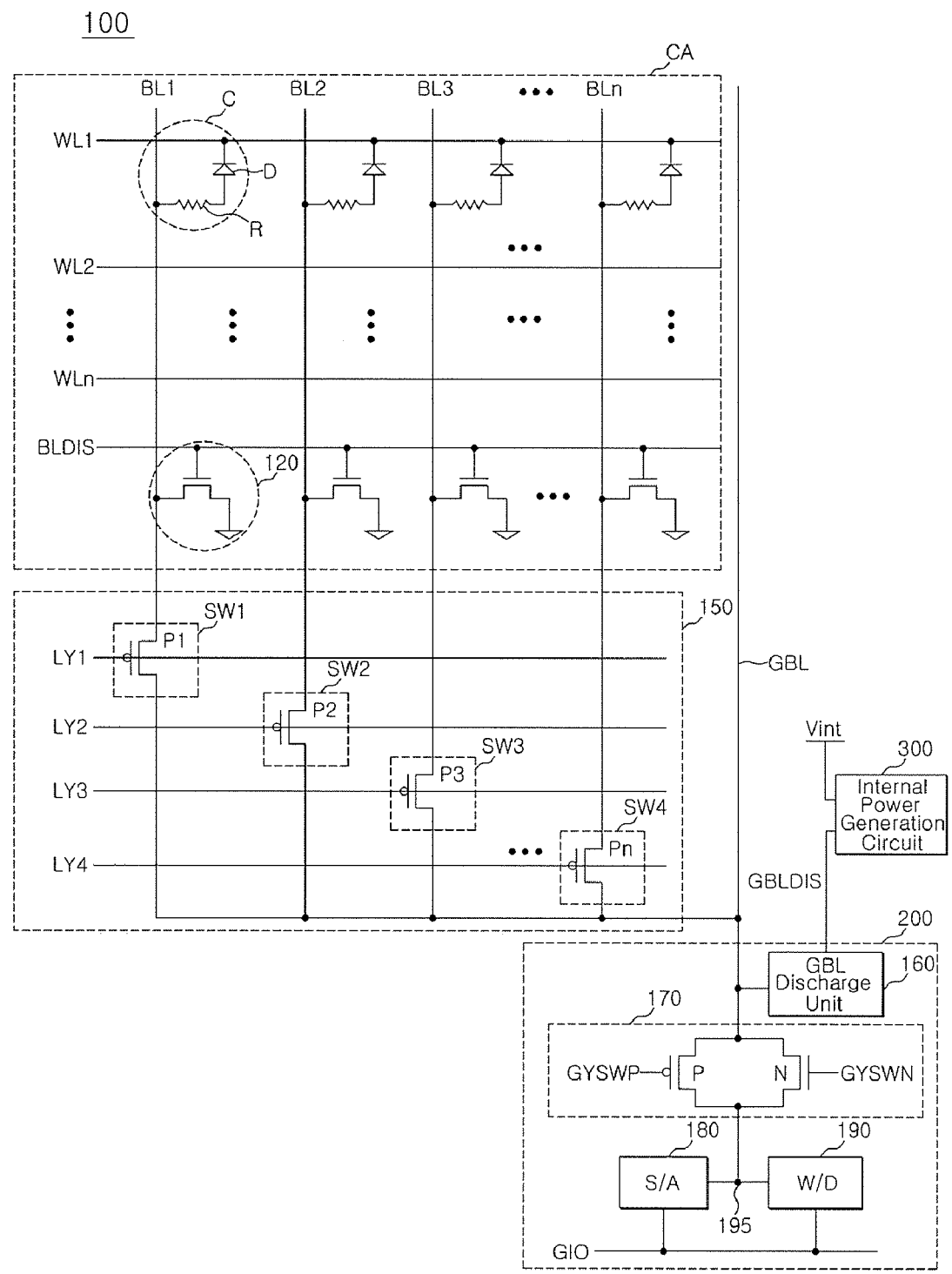
FIG. 1 is a configurational view illustrating a part of a cell array of a phase change memory apparatus according to one embodiment.

Referring to FIG. 1, a phase change memory apparatus 100 according to one embodiment can include a cell array CA, a column switch unit 150, a column control circuit 200, and an internal power generation circuit 300.

The cell array CA includes a plurality of word lines WL1-WLn and a plurality of bit lines BL1-BLn, which are arranged to intersect with each other. Respective points of intersection of the plurality of word lines WL1-WLn with the plurality of bit lines BL1-BLn are provided with memory cells C, respectively. The memory cells C can include phase change resistors R connected with the bit lines BL1-BLn, and diodes D connected between the word lines WL1-WLn and the phase change resistors R. Active switches such as MOS transistors can be used in place of the diodes D.

The cell array CA can further include a bit line discharge line BLDIS which is arranged below the plurality of word lines WL1-WLn and extends parallel to the word lines WL1-WLn. The bit line discharge line BLDIS also intersects with the plurality of bit lines BL1-BLn, and discharge circuit elements 120 are disposed at respective points of intersection. The discharge circuit elements 120 may include MOS transistors which are configured to discharge the signals of the bit lines BL1-BLn to a ground voltage when the bit line discharge line BLDIS is enabled. However, the discharge circuit elements 120 are not limited thereto, and can also be used as dummy cells of the same type as the memory cells.

A global bit line GBL is arranged on a side of the plurality of bit lines BL1-BLn on the outer periphery of the cell array CA, and extends parallel to the bit lines BL1-BLn. The global bit line GBL serves as a significant bit line for integrated control of the bit lines BL1-BLn.

The column switch unit 150 includes local switches SW1-SWn which connect the global bit line GBL with the respective bit lines BL1-BLn. The plurality of local switches SW1-SWn are configured to supply the signals of the corresponding bit lines BL1-BLn to the global bit line GBL in response to column select signals LY1-LYn. The column select signals LY1-LYn are activated one by one in an active mode and select unit cells C connected to the corresponding bit lines BL.

The column control circuit 200 is disposed on one end of the global bit line GBL. The column control circuit 200 includes a GBL discharge unit 160, a global column switch 170, a sense amplifier (S/A) 180, and a write driver (W/D) 190.

Figure 2:
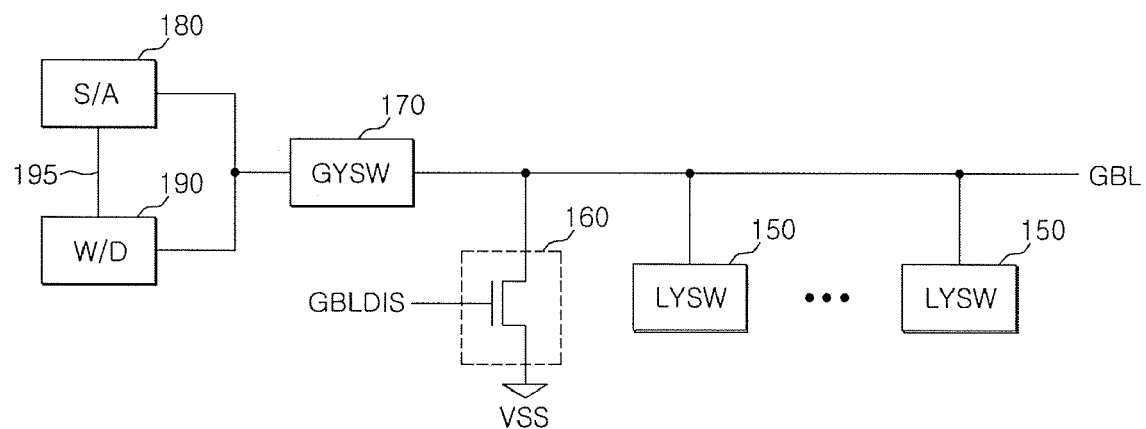
FIG. 2 is a schematic view illustrating the transmission paths of read and write currents in the phase change memory apparatus according to one embodiment.
Figure 3:
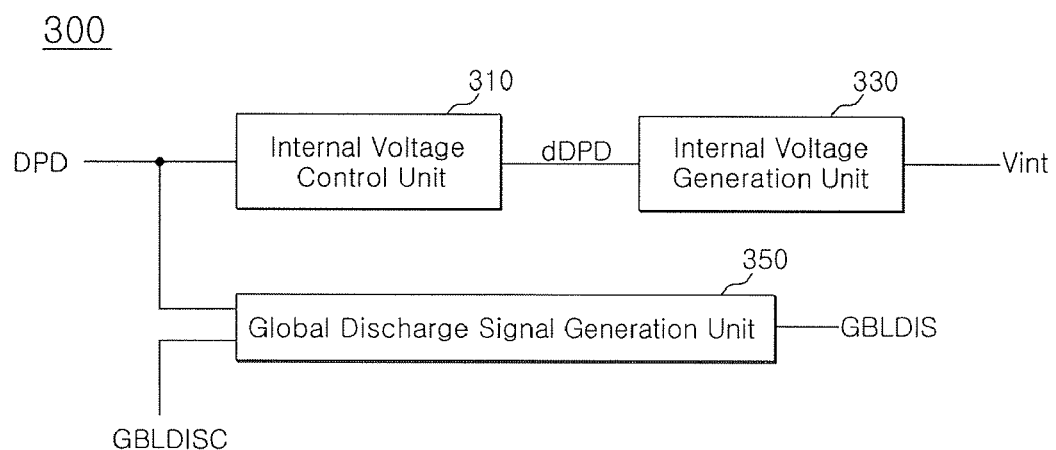
FIG. 3 is a block diagram showing an internal power generation circuit of the phase change memory apparatus according to one embodiment.

The GBL discharge unit 160 is configured to discharge the signal loaded on the global bit line GBL, in response to a global bit line discharge signal GBLDIS. The global discharge unit 160 may include an NMOS transistor which is driven in response to the global bit line discharge signal GBLDIS as shown in FIG. 2.

The global column switch 170 serves as a switch which selectively connects a node 195 (hereinafter referred to as a connection node), connecting the sense amplifier 180 and the write driver 190, and the global bit line GBL. The global column switch 170 may include a PMOS transistor P which is configured to electrically connect the connection node 195 and the global bit line GBL in response to a first global column switching signal GYSWP, and an NMOS transistor N which is configured to electrically connect the connection node 195 and the global bit line GBL in response to a second global column switching signal GYSWN. The first and second global column switching signals GYSWP and GYSWN may be signals which have opposite phases.

The sense amplifier 180 is configured to sense the data of the cell C which is applied via the global bit line GBL, compare the data with a reference voltage, and determine data "1" or "0".

The write driver 190 is configured to supply the global bit line GBL with a driving voltage corresponding to write data when writing the data of the cell C.

Thus, the phase change memory apparatus 100 configured as mentioned above has a current transmission path in which the current supplied from the sense amplifier 180 or the write driver 190 is transferred to the corresponding memory cell C through the global column switch 170, the global bit line GBL, the column switch unit 150, and the bit lines BL1-BLn, as shown in FIG. 2.

The internal power generation circuit 300 includes an internal voltage control unit 310, an internal voltage generation unit 330, and a global discharge signal generation unit 350.

Figure 4:
FIG. 4 is a detailed circuit diagram of an internal voltage control unit shown in FIG. 3.

The internal voltage control unit 310 is configured to control the driving of the internal voltage generation unit 330 in the deep power down mode, that is, when a deep power down mode signal DPD is enabled. In detail, the internal voltage control unit 310 is configured to maintain power supply while the global bit line GBL is discharged when entering the deep power down mode. The internal voltage control unit 310 receives the deep power down mode signal DPD and generates a delayed deep power down mode signal dDPD. The internal voltage control unit 310 may comprise, but not limited to, a delay unit composed of a chain of a plurality of inverters as shown in FIG. 4. The delay value of the internal voltage control unit 310 corresponds to a time capable of completely discharging the global bit line GBL. That is, the delay time value of the internal voltage control unit 310 is a predetermined time period which allows the global bit lines sufficient amounts of time to substantially discharge signals.

The internal voltage generation unit 330 is configured to generate an internal voltage Vint in the active mode and interrupt the generation of the internal voltage Vint when the delayed deep power down mode signal dDPD is enabled. Accordingly, the output currents of the internal circuit of the semiconductor memory apparatus become zero.

The global discharge signal generation unit 350 is configured to generate a global bit line discharge signal GBLDIS in response to the deep power down mode signal DPD and a global bit line discharge command GBLDISC. Namely, the global discharge signal generation unit 350 is configured such that the global bit line discharge signal GBLDIS is enabled when both the deep power down mode signal DPD and the global bit line discharge command GBLDISC are enabled. The global bit line discharge command GBLDISC may be a signal which is always enabled.

Figure 5:
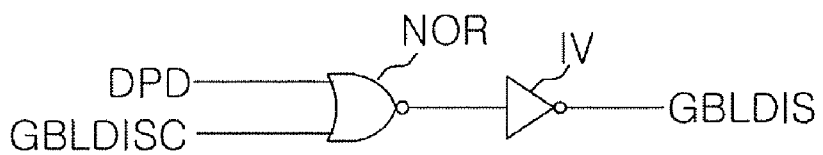
FIG. 5 is a detailed circuit diagram of a global discharge signal generation unit shown in FIG. 3.

As shown in FIG. 5, the global discharge signal generation unit 350 can include a NOR gate NOR which receives the deep power down mode signal DPD and the global bit line discharge command GBLDISC, and an inverter IN which inverts the output signal of the NOR gate NOR.

In the phase change memory apparatus having the configuration as stated above, when the deep power down mode signal DPD is enabled, while the internal voltage control unit 310 delays the deep power down mode signal DPD for a predetermined time, the global bit line discharge signal GBLDIS is enabled such that all the signals loaded on the global bit line GBL are discharged. Thereafter, the level of the internal voltage Vint as the output level of the internal voltage generation unit 330 is controlled, that is, dropped using the delayed deep power down mode signal dDPD.

As a consequence, since the internal voltage is continuously supplied when the deep power down mode signal DPD is enabled and the global bit line GBL is discharged, it is possible to prevent or protecting against discharge speeds from decreasing.

Also, since only the global bit line GBL is discharged in the deep power down mode and the bit lines BL connected thereto are floated, then cell data can be protected.

Because the discharge speed is improved in this way, a problem caused in terms of latch-up can be solved or minimized, and as a result current consumption characteristics can be improved.

The present invention is not limited to the above-mentioned embodiments.

It is obvious to those skilled in the art that, although the semiconductor memory apparatus according to the embodiment has been described with reference to a plurality of bit lines and one single global line for the sake of convenience in explanation, the semiconductor memory apparatus includes a plurality of global lines.

While certain embodiments have been described above, it will be understood to those skilled in the art that the embodiments described are by way of example only. Accordingly, the phase change memory apparatus having a global bit line and the method for driving the same described herein should not be limited based on the described embodiments. Rather, the phase change memory apparatus having a global bit line and the method for driving the same described herein should only be limited in light of the claims that follow when taken in conjunction with the above description and accompanying drawings.

What is claimed is:

1. A phase change memory apparatus comprising:
a global bit line configured to integratedly control a plurality of bit lines; and
an internal power generation circuit configured to supply an internal voltage while the global bit line is discharged and control the internal voltage after the global bit line is discharged, when a deep power down mode signal is enabled.

2. The phase change memory apparatus according to claim 1, wherein the internal power generation circuit comprises:
an internal voltage control unit configured to receive the deep power down mode signal and output a control signal; and
an internal voltage generation unit configured to control generation of the internal voltage in response to the control signal.

3. The phase change memory apparatus according to claim 2, wherein the internal voltage control unit comprises a delay unit, and the control signal is a delayed deep power down mode signal which is delayed for a predetermined time.

4. The phase change memory apparatus according to claim 3, wherein the predetermined time is for substantially completely discharging the global bit line.

5. The phase change memory apparatus according to claim 2, wherein the internal power generation circuit further comprises:
a global discharge signal generation unit configured to generate a signal for discharging the global bit line in response to the deep power down mode signal.

6. The phase change memory apparatus according to claim 5, wherein the global discharge signal generation unit is configured to generate a signal for discharging the global bit line when both the deep power down mode signal and a global bit line discharge command are enabled.

7. A phase change memory apparatus comprising:
phase change memory cells disposed between intersecting word and bit lines;
global bit lines configured to classify and integratedly control groups of bit lines each group having a predetermined number of bit lines;
an internal voltage generation unit configured to supply power for driving the phase change memory cells; and
an internal voltage control unit configured to control driving of the internal voltage generation unit when entering a deep power down mode, wherein the internal voltage control unit is configured to maintain the internal voltage generation unit in driving the phase change memory cells until the global bit lines are substantially discharged when entering the deep power down mode.

8. The phase change memory apparatus according to claim 7, wherein the internal voltage control unit comprises a delay unit which receives a deep power down mode signal for determining entry to the deep power down mode and delays the deep power down mode signal for a predetermined time.

9. The phase change memory apparatus according to claim 8, wherein the predetermined time allows the global bit lines sufficient amounts of time to substantially discharge.

10. The phase change memory apparatus according to claim 8, further comprising:
a global discharge signal generation unit configured to generate a signal for discharging the global bit lines in response to the deep power down mode signal.

11. The phase change memory apparatus according to claim 10, wherein the global discharge signal generation unit is configured to generate the signal for discharging the global bit lines when both the deep power down mode signal and a global bit line discharge command are enabled.

12. A method for driving a phase change memory apparatus, comprising the step of:
generating an internal voltage until a global bit line connected with a plurality of bit lines of phase change memory cells is substantially completely discharged, and then interrupting supply of the internal voltage, when a deep power down mode is entered.

* * * * *